(12) United States Patent
Furman et al.

(10) Patent No.: US 7,288,840 B2
(45) Date of Patent: Oct. 30, 2007

(54) STRUCTURE FOR COOLING A SURFACE

(75) Inventors: Bruce K. Furman, Poughquag, NY (US); Yves Martin, Ossining, NY (US); Theodore G. van Kessel, Millbrook, NY (US)

(73) Assignee: International Business Machines Corporation, Armonk, NY (US)

( * ) Notice: Subject to any disclaimer, the term of this patent is extended or adjusted under 35 U.S.C. 154(b) by 112 days.

(21) Appl. No.: 11/037,670

(22) Filed: Jan. 18, 2005

(65) Prior Publication Data

US 2006/0157858 A1    Jul. 20, 2006

(51) Int. Cl.
*H01L 23/34* (2006.01)
(52) U.S. Cl. ............... 257/719; 257/720; 257/721; 257/E23.102; 257/E23.103
(58) Field of Classification Search ............... 257/719
See application file for complete search history.

(56) References Cited

U.S. PATENT DOCUMENTS

| | | | | |
|---|---|---|---|---|
| 5,375,655 A | * | 12/1994 | Lee | 165/185 |
| 6,084,895 A | * | 7/2000 | Kouchi et al. | 372/36 |
| 6,301,109 B1 | | 10/2001 | Chu et al. | |
| 6,453,987 B1 | * | 9/2002 | Cheng | 165/80.3 |
| 2004/0087116 A1 | * | 5/2004 | Nakayama | 438/487 |

OTHER PUBLICATIONS

Hukseflux, Thermal Conductivity Science, 1999.*

* cited by examiner

*Primary Examiner*—Tu-Tu Ho
(74) *Attorney, Agent, or Firm*—Patterson & Sheridan, LLP; Kin-Wah Tong, Esq.; Ido Tuchman, Esq.

(57) ABSTRACT

An apparatus for cooling a surface having a metal structure made of a material with high thermal conductivity, and designed to provide efficient cooling of the surface while minimizing mechanical stress between the metal structure and the surface.

19 Claims, 8 Drawing Sheets

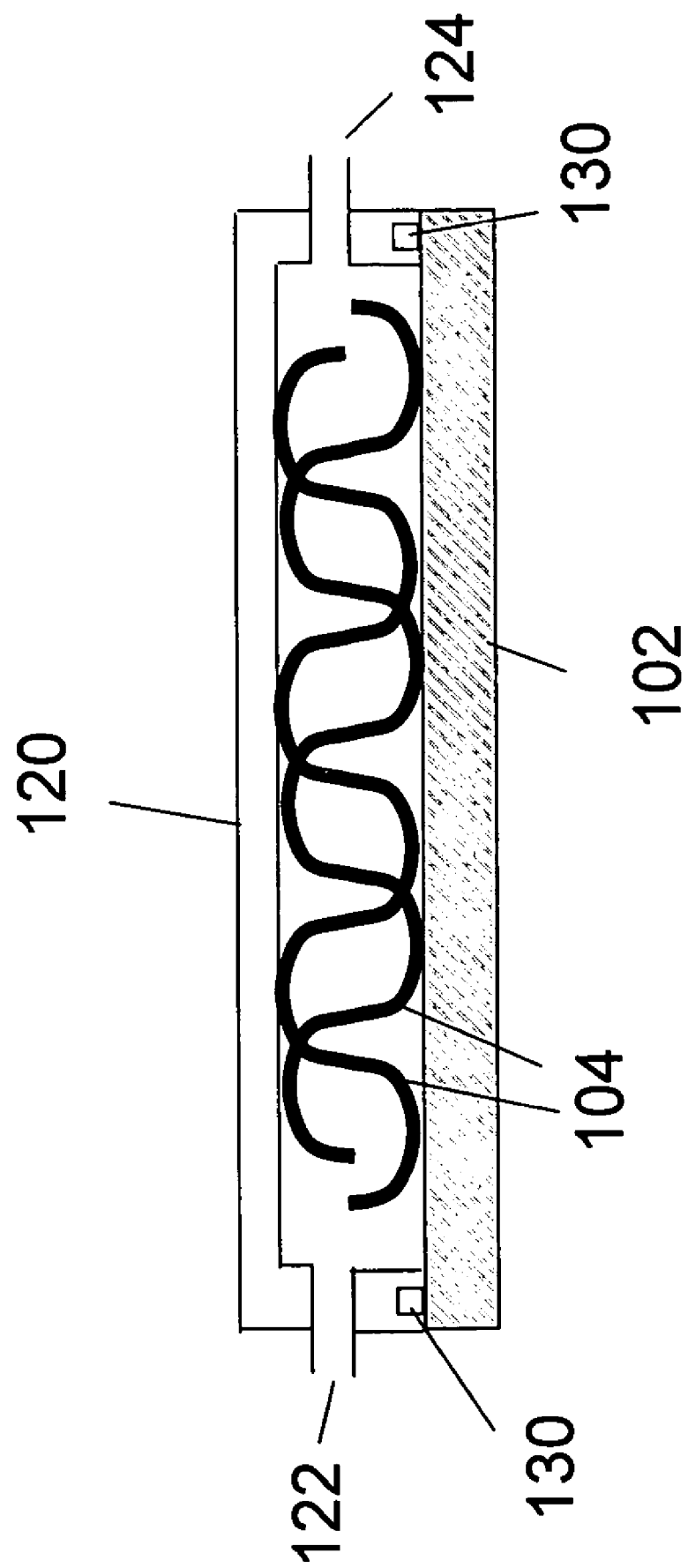

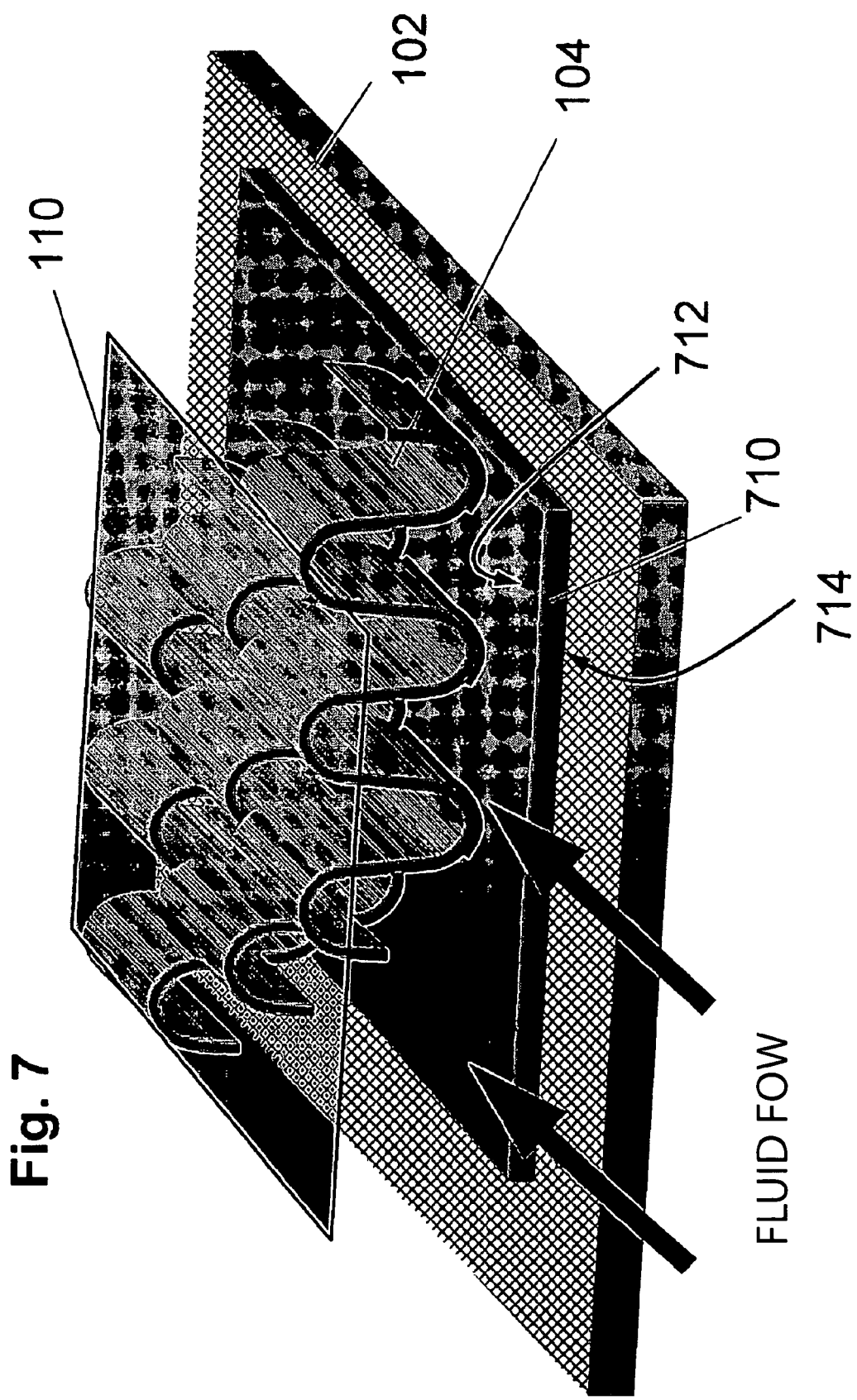

STRUCTURE FOR COOLING A SURFACE

REFERENCE TO GOVERNMENT FUNDING

The present invention was made with Government support under Contract No. H98230-04-C-0920, awarded by the Maryland Procurement Office. The Government has certain rights in this invention.

FIELD OF THE INVENTION

The invention relates to a structure for cooling, and more particularly, a flexible structure for attaching to a surface to be cooled.

BACKGROUND OF THE INVENTION

In silicon chip cooling, the heat generated by the chip is ultimately removed by a heat sink, which is usually cooled by air or liquid. It is crucial to have a path of high thermal conductivity between the chip and the heat sink. The simplest form of chip cooling consists in a heat sink made of a high conductivity material, ideally copper, directly bonded to the chip. However, direct bonding of a copper heat sink is limited because of mechanical reliability issues. Due to the considerable difference in thermal coefficients of expansion (TCE) of silicon and copper, mechanical stress often leads to delamination or formation of cracks between the silicon chip and the copper heat sink.

Several methods that have been used to address this problem include, for example, interposing a thermal paste between the chip and the heat sink to eliminate stress. A major drawback, however, is the low thermal conductivity of the paste. Another approach is to provide bonding between the copper heat sink and the silicon chip via an intermediate spreader (usually made of SiC) with TCE closely matched to silicon. This approach adds to process complexity, costs, and non-optimized thermal conductivity.

A recent approach involves the use of a liquid metal layer, e.g., gallium, or various alloys that include gallium, between the chip and the heat sink. This is disclosed in U.S. patent application Ser. No. 10/665,798, "METHOD AND APPARATUS FOR CHIP COOLING", filed on Sep. 18, 2003. However, alternative cooling structures with improved thermal matching and mechanical reliability are still needed.

SUMMARY OF THE INVENTION

One aspect of the invention provides an apparatus for cooling a substrate, comprising a metal structure having a plurality of contact regions for attaching to the substrate, the metal structure defining at least one channel for a fluid flow; where the plurality of contact regions defines an attachment area between the metal structure and the substrate that is substantially smaller than an area of contact between the metal structure and the fluid flow; and an enclosure disposed over the substrate and around the metal structure for confining the fluid flow.

Another aspect of the invention provides an apparatus for cooling a substrate, comprising a metal structure made from a metal having a first thermal coefficient of expansion, where the metal structure has a first side for attaching to the substrate having a second thermal coefficient of expansion that is different from the first thermal coefficient of expansion, and the metal structure is configured to provide at least one of sufficiently small dimensions and sufficient flexibility for relieving mechanical stress arising from different thermal expansions of the substrate and the metal structure.

Another aspect of the invention provides a method of cooling a substrate, comprising: providing a metal structure having at least one channel, the metal structure being coupled to the substrate to define an attachment area between the metal structure and the substrate; providing an enclosure above the substrate and around the metal structure; flowing a fluid inside the enclosure and through the at least one channel of the metal structure such that the fluid contacts a surface area of the metal structure that is substantially larger than the attachment area between the metal structure and the substrate.

Yet another aspect of the invention provides a method of cooling a substrate, comprising: providing a metal structure having at least one channel, the metal structure being thermally coupled to the substrate, and configured to provide at least one of sufficiently small dimensions and sufficient flexibility for relieving mechanical stress arising from different thermal expansions between the substrate and the metal structure; providing an enclosure above the substrate and around the metal structure; and flowing a fluid coolant inside the enclosure and through the at least one channel of the metal structure.

BRIEF DESCRIPTION OF THE DRAWINGS

So that the manner in which the above recited embodiments of the invention are attained and can be understood in detail, a more particular description of the invention, briefly summarized above, may be obtained by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

FIG. 7 illustrates a heat sink structure with a base plate.

To facilitate understanding, identical reference numerals have been used, where possible, to designate identical elements that are common to the figures.

DETAILED DESCRIPTION

Figure 1A:
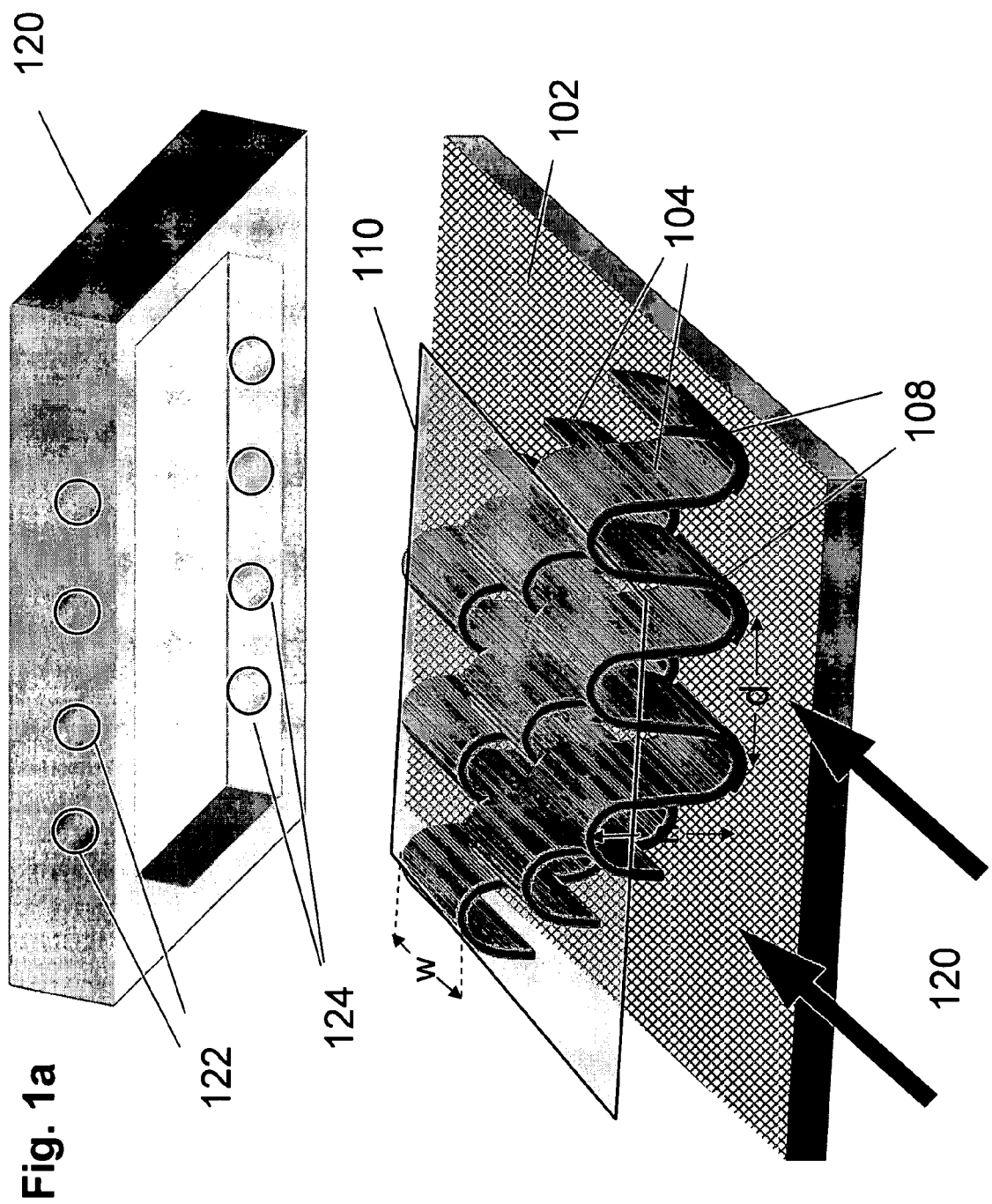
FIG. 1 illustrates one configuration of a heat sink structure with metal ribbons and an enclosure for the heat sink structure.

This invention relates to a structure for cooling a surface, and more particularly, a heat sink attached or bonded to a surface to allow efficient cooling while minimizing undesirable mechanical stress. Although this structure is particularly well-suited for cooling a silicon chip, it can generally be applied to cooling other surfaces or articles. The structure, which is made of a material (may be a single-component or multi-component material) with relatively high thermal conductivity, e.g., larger than about 200 W/mK, is designed with sufficient flexibility and/or small dimensions to maintain mechanical integrity and compliance between the surface to be cooled and the structure, which may have a thermal coefficient of expansion that is very different from the surface to be cooled. For convenience sake, the surface to be cooled will also be referred to as the "hot" surface in this discussion. Suitable materials for the heat sink include, for example, metals such as copper, silver or aluminum, or a material such as silicon carbide (SiC), aluminum silicon carbide (AlSiC), diamond or graphite. Mixed sintered form of such materials, e.g., small particles of diamond within a matrix of lower conductivity material such as AlSiC, can also be used to form the structure of this invention. Such a material (diamond particles within an AlSiC matrix) is available commercially with a thermal conductivity on the order of 600 W/mK (compared with thermal conductivities of about 1000 W/mK for single crystal diamond or graphite).

The structure, which can be implemented in several embodiments, generally has an "open" design—e.g., it has one or more channels or pathways within the structure to allow a fluid (or coolant) to flow through the structure. These channels or pathways may also be referred to as internal channels. The shapes and dimensions of the structure are designed to reduce mechanical stress arising from thermal expansion mismatch between the heat sink material and the hot surface, e.g., by providing structural flexibility or mechanical compliance and/or having relatively small contact areas between the structure and the hot surface. The structure is attached or bonded to the hot surface at selected or predetermined contact regions, and it is preferable that a relatively large fraction of the hot surface, e.g., at least about one half, is attached or coupled to the heat sink structure to facilitate efficient cooling. By keeping the contact area between the structure and the hot surface to be substantially smaller than the surface area of the structure exposed to the fluid flow (the "exposed" area), mechanical stress can be reduced while still maintaining efficient heat transfer. Since the heat sink material has a relatively large thermal conductivity, the relatively small attachment or contact area will not significantly affect heat conduction from the hot surface.

During operation, a cooling fluid is allowed to flow through the one or more channels of the structure. Suitable cooling fluids may include, for example, water, glycol, freon, chlorofluoro-carbons and substitutes (or other refrigerants), Dynalene® heat transfer fluids (e.g., Dynalene HC, a water-based heat transfer fluid), butane, propane, hexane, and similar alkanes or other organic compounds, liquid metals such as alloys of gallium-indium-tin, air or other gases, e.g., non-reactive or inert gases, nitrogen, helium, among others. By providing a relatively large surface area (within a given volume occupied by the structure) of contact between the heat sink and the cooling fluid, efficient cooling of the heat sink, and thus, the hot surface, can be achieved. Optimal fluid utilization can be achieved by the use of a fluid flow under low pressure over a large cooling surface area of the heat sink.

In one embodiment, the structure comprises metallic ribbons 104 directly attached to a hot surface to be cooled. FIG. 1a illustrates one configuration in which the troughs of the ribbons 104 rest on a substrate 102 (e.g., hot surface of a semiconductor device), with the bottom of each trough forming the contact areas 108 with the substrate 102. In one example, the height (h) of the ribbons above the substrate 102 and the width (w) of the ribbons are on the order of 1 mm, and each ribbon 104 has a thickness (t) on the order of 0.1 mm. In another example, the height (h) of the ribbons is about five times the distance (d) between adjacent troughs. In other embodiments, the thickness of the ribbon may range from about 0.05 mm to about 0.5 mm. The fluid flow is parallel to the substrate 102 and along a direction of low flow resistance. In one example, a cooling rate of about 20 W/cm.sup.2/C (Watt per centimeter square per degree centigrade) is achieved with a water flow rate of about 2 lpm (liter per minute) at a pressure of about 5 psi (pound per square inch). In general, flow rates within a range of about 0.5 to about 5 lpm and a pressure in a range of about 1 to about 10 psi are sufficient to provide adequate cooling for semiconductor and integrated circuits types of applications (e.g., with temperature range of about 50 to 100. degree. C., power of about 50 to 500 W, and a semiconductor substrate area of about 0.5 to 5 cm.sup.2). The fluid is confined to a region above the substrate 102 by an enclosure 120, which is shown schematically in FIG. 1a. The enclosure 120 can be attached to the substrate 102 using a variety of known methods to provide a leak-proof seal for fluid confinement on the sides. The enclosure 120 may have its own inlet 122 and outlet 124 for directing the fluid flow to and from the substrate 102, or it may also be a part of a larger manifold (not shown) used to direct coolant fluid to this and possibly many other substrates. FIG. 1b shows a cross-sectional view of the enclosure 120 installed over the substrate 102 and around the metal ribbons 104, or more generally, the heat sink structure. The enclosure 120 may be attached to the substrate 102 by any appropriate mechanical means, e.g., using a clamp (not shown), with a gasket 130 at the bottom of the enclosure 120 to provide a leak-proof seal with the substrate 102. It is understood that enclosure 120, or variations thereof, may be used with other embodiments of the present invention to be described below.

In an alternative embodiment, an optional top sheet (or support sheet) 110 may be provided for attaching to the "top" sides or troughs of the metallic ribbons 104. This configuration offers several advantages. For example, the manufacturing and packaging of the structure can be facilitated by pre-attaching one side of each metallic ribbon 104 to the top sheet 110 before the entire structure is installed or attached to the substrate 102. Additional mechanical stability can be achieved with the top sheet 110 providing anchoring points for the metallic ribbons 104. Furthermore, the top sheet 110 may serve as a top confinement for the cooling fluid, in which case, it may also be a part of the enclosure 120. In general, the top sheet 110 may be made from a variety of materials, and can be attached to the metallic ribbons 104 using any appropriate methods. When the top sheet 110 is made of a thermally conductive material and attached with good thermal coupling to the metallic ribbons 104, it may also result in additional cooling by acting as part of the heat sink structure.

Figure 2:
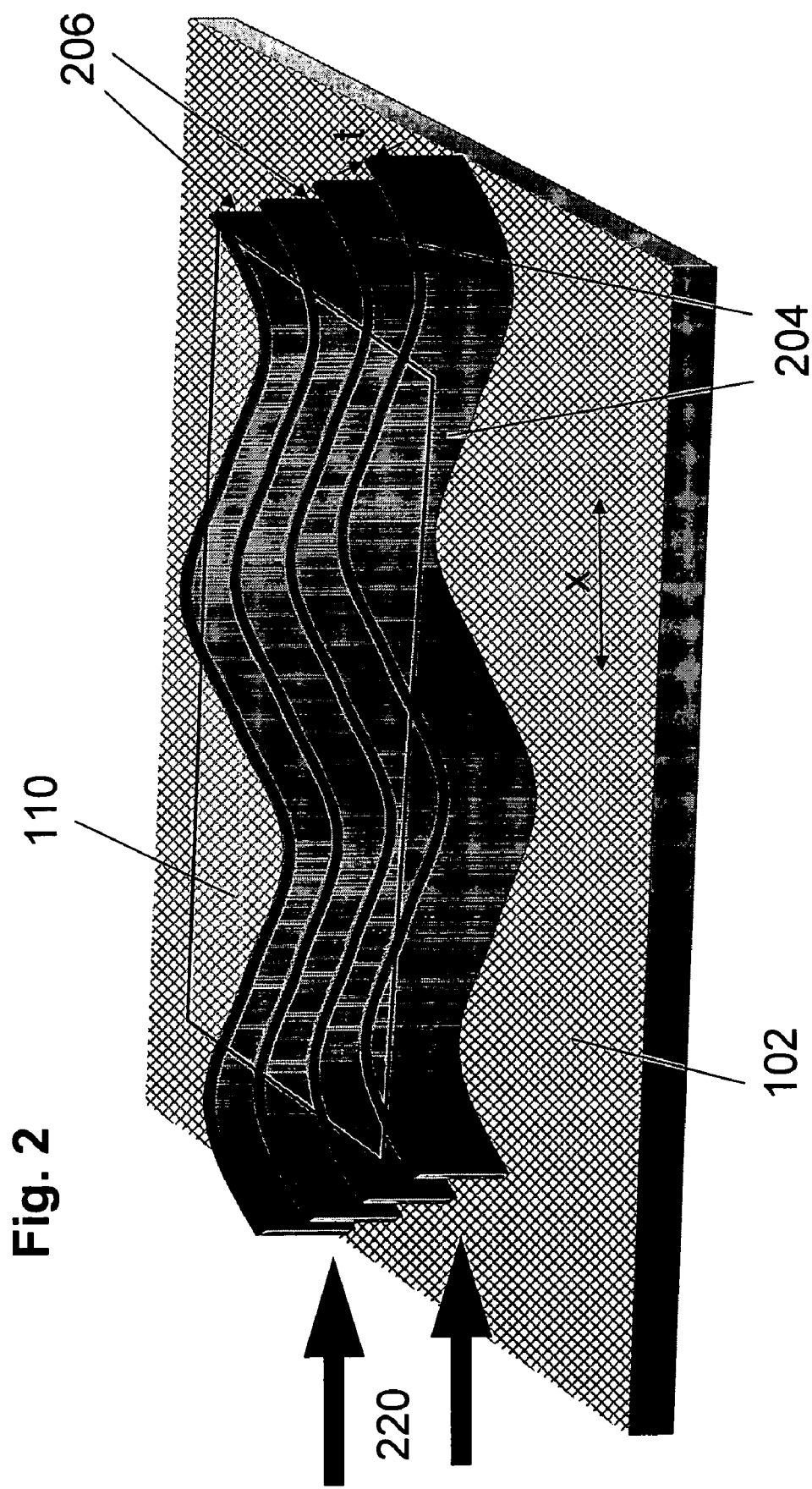
FIG. 2 illustrates another configuration of a heat sink with metal ribbons.

FIG. 2 illustrates another configuration of a heat sink structure comprising metal ribbons 204, with the side of each ribbon contacting the substrate 102 along the entire length of the ribbon. In this case, the contact area between each ribbon 204 and the substrate 102 is given by the product of the thickness (t) and the length (l) of the ribbon 204. During cooling operation, a fluid flows over the substrate 102 along flow direction 220 through channels 206 defined by adjacent ribbons 204. The relatively large surface area of contact between the fluid and the heat sink structure allows efficient heat transfer. When the substrate expands in the x-direction, i.e., generally along the longitudinal direction of the ribbons, the ribbons can expand like an accordion, thereby relieving the stress along this direction that would otherwise occur due to mismatch in the thermal expansions. In the direction perpendicular to x, the extent of the ribbons (approximately, the ribbon thickness) is small and does not build much stress over the short distance. The periodicity of the ribbon's "wave" (i.e., peak-to-peak or trough-to-trough spacing) is typically a millimeter. As shown in the figures, ribbons 204 may also be attached to the optional top sheet 110. Furthermore, slots or cuts (not shown) may be provided at the bottom sides (facing the substrate) of the ribbons for added flexibility, if desired.

In the above embodiments, mechanical stress arising from the thermal expansion mismatch between the ribbon material and the substrate 102 can be relieved by one or more of the following features in the metal ribbons—the curls or bends in the ribbons; the cuts or slots in the ribbons; and the small thickness of the ribbons. The dimensions given above are illustrative for liquid cooling applications. In the case of air or other gas cooling, the dimensions of the structures can be scaled appropriately according to the thermal conductivity. For example, since the thermal conductivity of air is two orders of magnitude smaller than water, the structure's dimension should be increased accordingly to achieve the desired cooling rate.

Figure 3:
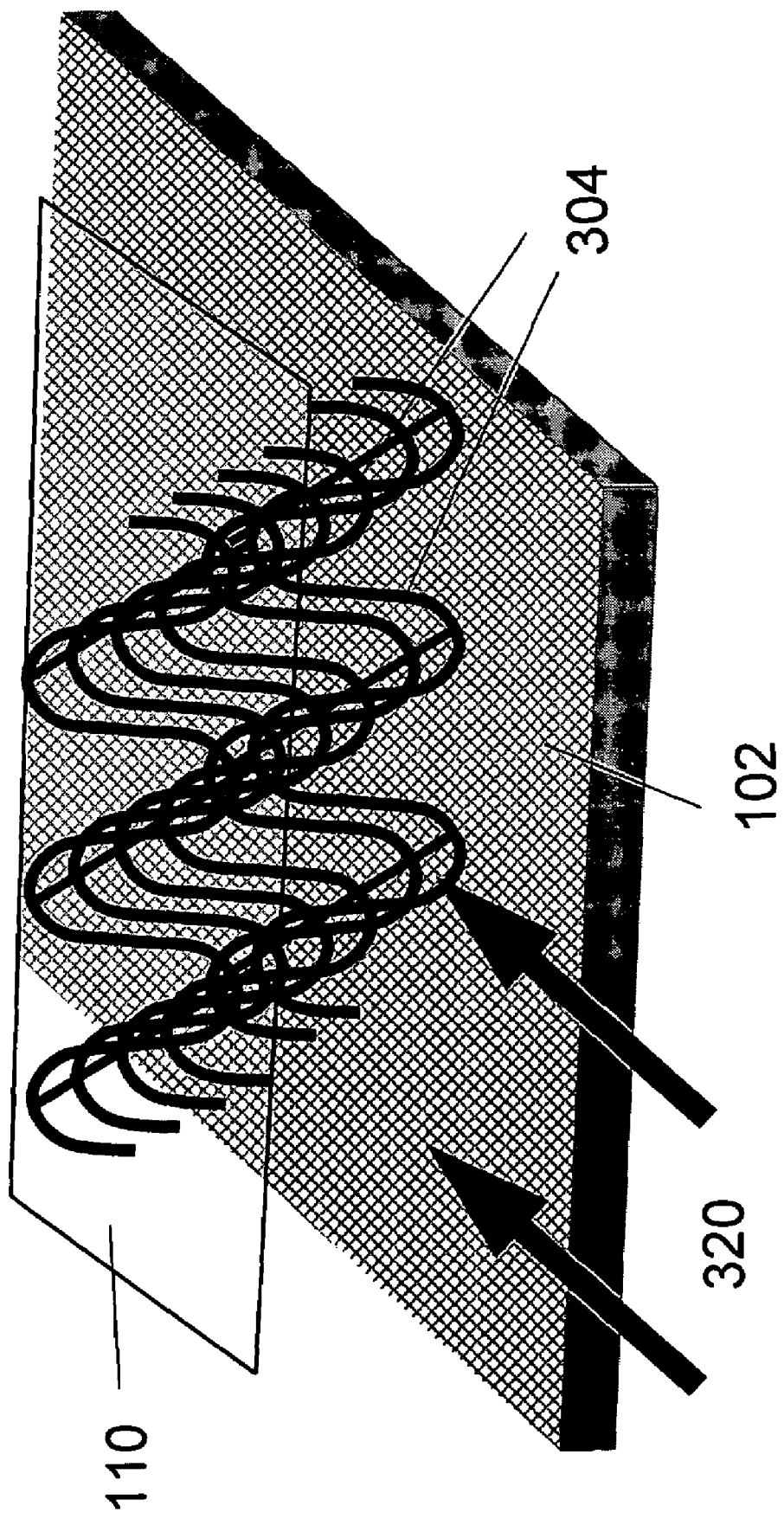
FIG. 3 illustrates a heat sink structure with metal mesh.

In another embodiment, the structure comprises metallic coils or meshes 304, which may generally include woven or non-woven metallic threads, filaments, or strands. As shown in the example of FIG. 3, the portion of metallic meshes 304 contacting the substrate 102 is relatively small compared to the remaining portion that is not in contact with the substrate 102. A cooling fluid flows along a general direction 320 through the open spaces or channels within the coils or meshes 304. In this example, metallic meshes 304 are made of thin copper wires, having a diameter on the order of 0.1 millimeter, and a height of about 1 mm above the substrate.

Figure 4:
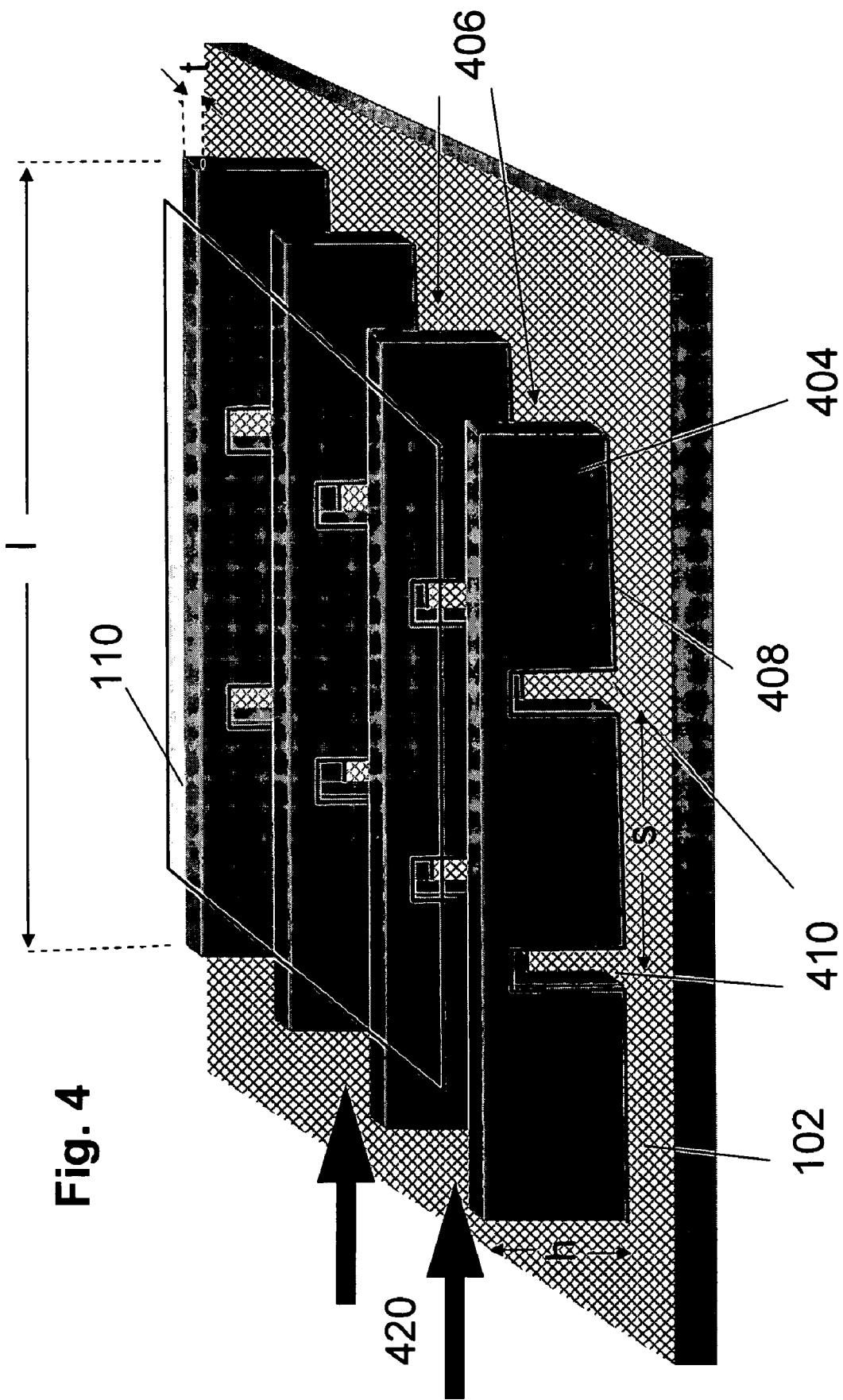
FIG. 4 illustrates a heat sink structure with slotted metal fins.

FIG. 4 illustrates another embodiment of a heat sink structure with slotted metal fins 404. The fins 404 contact the substrate 102 at contact areas 408, and a plurality of slots 410 in the metal fins 404 provide for flexibility or mechanical compliance in the structure, and relieve the stress that would otherwise build-up over a long and continuous interface. In one embodiment, each fin has a thickness (t) of about 0.2 mm, a height (h) of about 1 mm, a spacing (s) of about 2 mm between slots, and a total length (l) that corresponds to the length of the chip (10 to 20 mm). During operation, a fluid coolant flows along direction 420, through channels or pathways 406 defined by adjacent metal fins 404.

Figure 5:
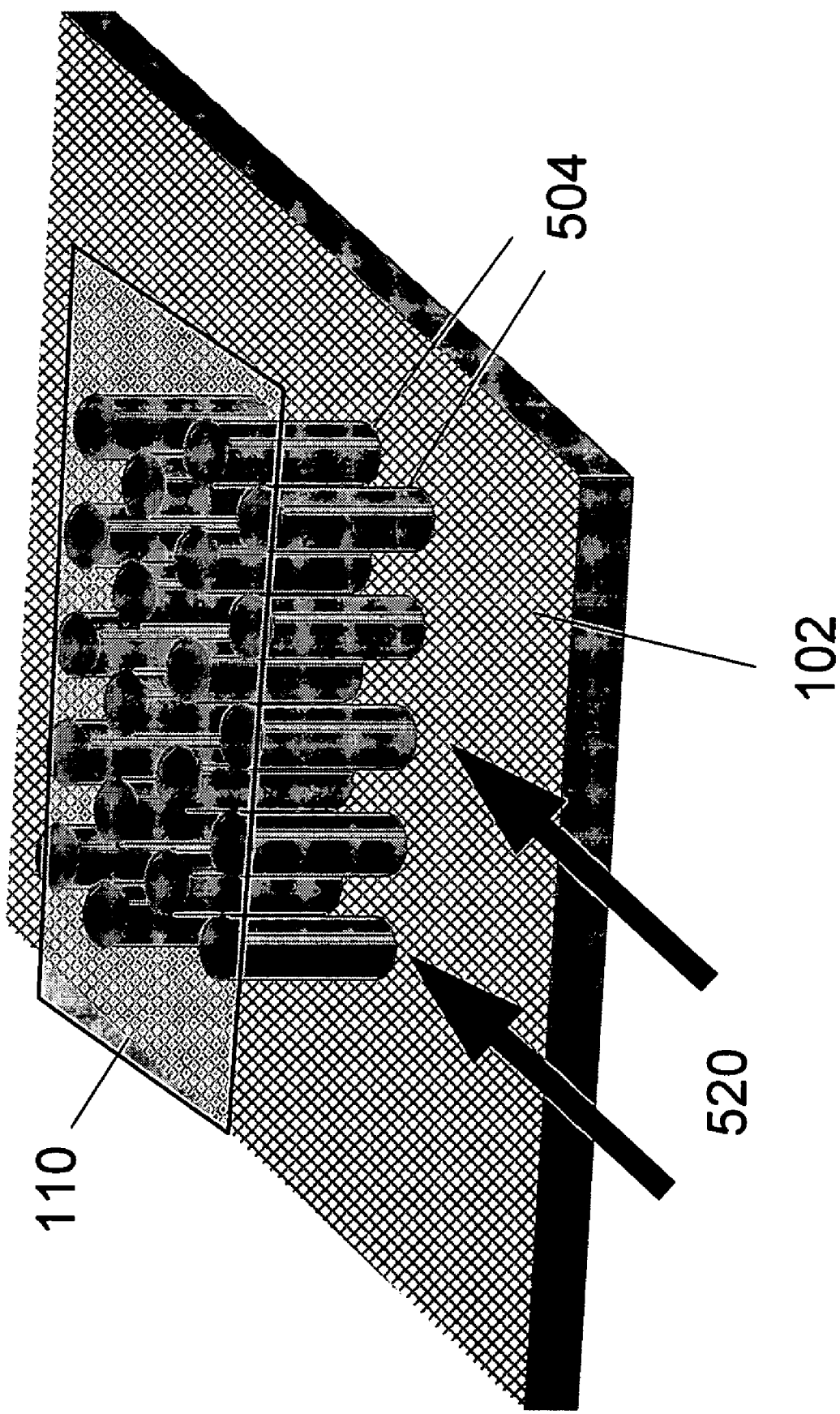
FIG. 5 illustrates a heat sink structure with metal pillars.
Figure 6:
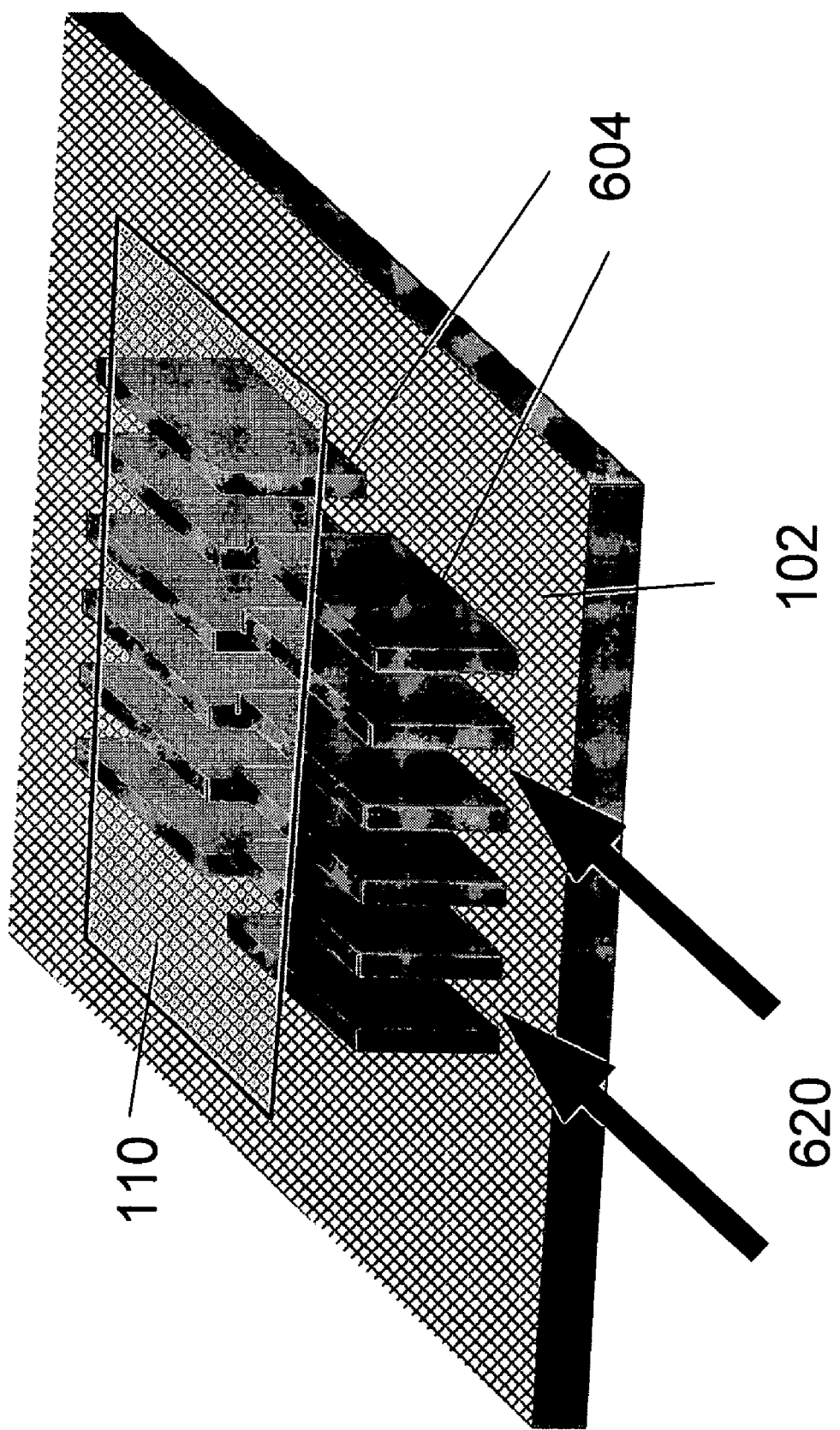
FIG. 6 illustrates a heat sink structure with metal fins.

Two other embodiments are illustrated in FIGS. 5 and 6, which show heat sink structures with metal pillars 504 and metal fins 604, respectively, directly attached to the substrate 102. Cooling fluid flows over the substrate 102 generally along directions 520 and 620 through spaces or channels defined by the pillar and fin arrangements. Although FIGS. 5-6 show the pillars 504 and fins 604 as being arranged in regular or periodic patterns, other arrangements, such as irregular patterns, are also possible. However, some form of regular patterns, e.g., optimized to provide maximize cooling and flow rate, is generally preferred. These pillars and fins are designed to be relatively small in size so that the mechanical stress are minimized over the small bonded areas. In one example, each Cu pillar has a height of about 1 mm and a cross-sectional area of about 0.05 mm$^2$. In another example, Cu fins having a height of about 1 mm, thickness of about 0.2 mm and length of about 2 mm are used. In other embodiments, heights ranging from about 0.5 mm to about 5 mm, fin thickness (or width) or pillar diameter between about 0.05 mm to about 0.5 mm, fin length from about 0.1 mm to about 2 mm may also be used. In these embodiments, even though the pillars or fins are fairly rigid, the small dimensions of the pillars or fins, i.e., dimensions of the contact area with the hot surface, result in only a small difference in relative motion (arising from the different rates in thermal expansion) between the substrate and the heat sink. Thus, the build up of stress (when the motion is constraint) is small. It should be understood that the dimensions of pillars and fins needed to provide for certain desired degree of acceptable mechanical stress in a particular cooling application will vary according to the specific materials used. For a given substrate or chip, it is preferable that the total area of the heat sink structure being cooled, i.e., area exposed to the cooling fluid, be at least about five times the area of the substrate. It is also preferable that this fluid-cooled or exposed area of the heat sink structure be at least 10 times the attachment area between the heat sink and the substrate, although a factor of at least 5 times is also acceptable.

The structures described above are preferably directly attached—e.g., soldered or bonded to the substrate or hot surface such as the backside of a semiconductor chip. Soldering materials include a well known range of materials such as tin, indium, bismuth, silver, gallium, lead, among others, and their alloys. Bonding materials include organic adhesives, e.g., cyanolite and epoxies. Alternately, the structures (particularly fins or pillars) can be directly grown by plating onto selected areas of the substrate. Metals such as Cu, Ni, Ag, and others are amenable to plating.

For each embodiment, the heat sink and the soldering material may optionally be covered with a material layer or coating to protect the heat sink or solder material from corrosion by the cooling fluid. In one example, the coating is a thermally conductive polymer such as Sylgard® Q3-3600, which is commercially available from Dow Corning. Depending on the specific material and application needs, the protective coating may have a thickness ranging from about 1 µm to about 10 µm. Furthermore, although soldering materials that are compatible with the heat sink material are generally preferred, in situations where there may be concerns of potential interaction between the soldering and the heat sink materials, a protective coating layer may also be used to limit such interactions. Such coating materials may include, for example, nickel, chromium, gold, platinum or combinations thereof.

In yet another embodiment, the heat sink structures described above may also be attached onto an interposed base plate, which is in turn attached to the substrate 102 using conventional methods such as soldering, bonding, liquid metal, thermal paste, . . . , etc. This is illustrated in FIG. 7, which shows a base plate 710 with metallic ribbons attached to the top surface 712, and the bottom surface 714 of the base plate 710 attached to the substrate 102. The thermal and mechanical properties of the base plate 710 should be optimized to provide efficient cooling and mechanical reliability. Not only does the use of this base plate 710 facilitate manufacturing and packaging of the heat sink structures, it also allows the substrate 102 to be isolated from the cooling fluid, thus alleviating concerns for potential reliability issues for cooling substrates such as semiconductor chips.

For this embodiment, two general approaches may be used. One involves the use of a base plate 710 made of a material with thermal coefficient of expansion (TCE) closely-matched to that of the substrate. For example, in the case of a silicon substrate, the base plate 710 may be made of silicon, silicon carbide, or invar steel, among others. The thickness is preferably large enough to provide sufficient mechanical integrity, but thin enough to allow for high thermal conductivity. For example, thickness values can range from about 0.05 to 0.5 millimeter.

Another approach involves using a base plate 710 that is sufficiently thin so that the mechanical stress produced is acceptable, despite a larger mismatch of TCE with the substrate 102. For example, in the case of a silicon substrate, the base plate 710 may be a thin foil of copper, silver or nickel, and a thickness less than about 0.03 millimeter will generally be acceptable.

Although various embodiments which incorporate the teachings of the present invention have been shown and described in detail herein, those skilled in the art can readily devise other embodiments without departing from the basic scope of the present invention.

The invention claimed is:

1. An apparatus for cooling a heat generating surface, comprising:
   a metal structure having a first side that includes a plurality of contact regions for attaching to the heat generating surface and a second side that is attached to a support sheet such that the metal structure is disposed between the support sheet and the heat generating surface, the metal structure defining at least one channel for a fluid flow;
   wherein the plurality of contact regions defines an attachment area between the metal structure and the heat generating surface that is substantially smaller than an area of contact between the metal structure and the fluid flow; and
   an enclosure disposed over the heat generating surface and around the metal structure and the support sheet for confining the fluid flow.

2. The apparatus of claim 1, wherein the heat generating surface comprises a first material with a first thermal conductivity, and the metal structure comprises a second material with a second thermal conductivity that is larger than the first thermal conductivity.

3. The apparatus of claim 1, wherein the metal structure comprises at least one of ribbon, mesh, pillar, fin, and agglomerated particles.

4. The apparatus of claim 2, wherein the metal structure is attached to the heat generating surface via an intermediate material layer with a thermal conductivity that is intermediate between the first and the second thermal conductivity.

5. The apparatus of claim 4, wherein, the intermediate material layer is a thin metal foil.

6. The apparatus of claim 1, wherein the metal structure is made of a material comprising at least one of copper, silver, aluminum, silicon carbide (SiC), aluminum silicon carbide (AlSiC), diamond and graphite.

7. The apparatus of claim 1, wherein the metal structure is further provided with a coating comprising a material selected from the group of nickel, chromium, tin, gold, platinum, and combination thereof.

8. The apparatus of claim 1, wherein the structure is coated with a polymer material.

9. The apparatus of claim 1, wherein the metal structure comprises a material compatible with a fluid selected from the group consisting of water, glycol, freon and chlorofluoro-carbons.

10. An apparatus for cooling a heat generating surface, the heat generating surface having a first thermal coefficient of expansion, comprising:
   a metal structure made from a metal having a second thermal coefficient of expansion that is different from the first thermal coefficient of expansion; and
   an enclosure disposed above the heat generating surface and around the metal structure,
   wherein the metal structure has a first side for attaching to the heat generating surface and a second side attached to a support sheet such that the metal structure is disposed between the support sheet and the heat generating surface,
   the metal structure being configured to provide at least one of sufficiently small dimensions and sufficient flexibility for relieving mechanical stress arising from different thermal expansions of the heat generating surface and the metal structure.

11. The apparatus of claim 10, wherein the metal structure comprises a plurality of fins, each having a height of about 0.5 mm to about 5 mm, a width of about 0.05 mm to about 0.5 mm, and a length of about 0.1 to 2 mm.

12. The apparatus of claim 10, wherein the metal structure comprises at least one channel for flowing a fluid to cool the surface.

13. The apparatus of claim 10, wherein the first side of the metal structure is attached to the heat generating surface by at least one intermediate material.

14. The apparatus of claim 13, wherein the at least one intermediate material is a soldering material.

15. The apparatus of claim 13, wherein the intermediate material comprises a thin metal foil, and the thin metal foil has one surface soldered to the first side of the metal structure and another surface soldered to the heat generating surface.

16. A method of cooling a heat generating surface, comprising:
   providing a metal structure having at least one channel, a first side of the metal structure being coupled to the heat generating surface to define an attachment area between the metal structure and the heat generating surface;
   providing a support sheet attached to a second side of the metal structure such that the metal structure is disposed between the support sheet and the heat generating surface;
   providing an enclosure above the heat generating surface and around the metal structure and the support sheet;
   flowing a fluid inside the enclosure and through the at least one channel of the metal structure;
   wherein the fluid contacts a surface area of the metal structure that is substantially larger than the attachment area between the metal structure and the heat generating surface.

17. The method of claim 16, wherein the metal structure is provided in a form selected from one of ribbon, mesh, coil, pillar, fin or agglomerated particles.

18. A method of cooling a heat generating surface, comprising:
   providing a metal structure having at least one channel, a first side of the metal structure being thermally coupled to the heat generating surface, the metal structure being configured to provide at least one of sufficiently small dimensions and sufficient flexibility for relieving mechanical stress arising from different thermal expansions between the heat generating surface and the metal structure;
   providing a support sheet attached to a second side of the metal structure such that the metal structure is disposed between the support sheet and the heat generating surface;
   providing an enclosure above the substrate heat generating surface and around the metal structure and the support sheet; and
   flowing a fluid coolant inside the enclosure and through the at least one channel of the metal structure.

19. The method of claim 18, wherein the metal structure is configured in a form selected from one of ribbon, mesh, coil, pillar, fin or agglomerated particles.

* * * * *